United States Patent
Kim et al.

(10) Patent No.: US 8,722,211 B2
(45) Date of Patent: May 13, 2014

(54) MAGNETIC MEMORY DEVICES AND METHODS OF MANUFACTURING SUCH MAGNETIC MEMORY DEVICES

(75) Inventors: Woojin Kim, Yongin-si (KR); Jangeun Lee, Suwon-si (KR); Sechung Oh, Suwon-si (KR); KyungTae Nam, Suwon-si (KR); Dae Kyom Kim, Daejeon (KR); Junho Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 464 days.

(21) Appl. No.: 12/656,145

(22) Filed: Jan. 19, 2010

(65) Prior Publication Data
US 2010/0183902 A1    Jul. 22, 2010

(30) Foreign Application Priority Data
Jan. 20, 2009 (KR) .................. 10-2009-0004679

(51) Int. Cl.
| | | |
|---|---|---|
| *G11C 11/15* | (2006.01) | |
| *G11B 5/39* | (2006.01) | |
| *G11C 11/14* | (2006.01) | |
| *G01R 33/09* | (2006.01) | |
| *H01F 10/10* | (2006.01) | |
| *H01F 10/14* | (2006.01) | |
| *H01F 10/16* | (2006.01) | |

(52) U.S. Cl.
CPC ............. *G11C 11/14* (2013.01); *G11C 11/15* (2013.01); *G01R 33/098* (2013.01); *G11B 5/3909* (2013.01); *H01F 10/10* (2013.01); *H01F 10/14* (2013.01); *H01F 10/16* (2013.01)

USPC ..... 428/811.1; 365/158; 257/30; 360/324.11; 360/324.12; 360/324.2

(58) Field of Classification Search
None
See application file for complete search history.

(56) References Cited

U.S. PATENT DOCUMENTS

| | | | | |
|---|---|---|---|---|
| 6,391,431 | B1 * | 5/2002 | Sano et al. ................. | 428/811.5 |
| 7,362,546 | B2 * | 4/2008 | Hasegawa et al. ....... | 360/324.11 |
| 2003/0128483 | A1 * | 7/2003 | Kamijo .................... | 360/324.11 |
| 2005/0157433 | A1 * | 7/2005 | Kamiguchi et al. ....... | 360/324.1 |
| 2006/0017081 | A1 * | 1/2006 | Sun et al. ..................... | 257/295 |

(Continued)

FOREIGN PATENT DOCUMENTS

| | | |
|---|---|---|
| JP | 2005-203702 A | 7/2005 |
| JP | 2008-085202 A | 4/2008 |
| JP | 2008-103661 A | 5/2008 |
| JP | 2008-103662 A | 5/2008 |

OTHER PUBLICATIONS

Kirk-Othmer Encyclopedia of Chemical Technology, John Wiley and Sons, "Cobalt and Cobalt Alloys", pp. 1-3 (copyright 1999-2012).*

*Primary Examiner* — Kevin Bernatz
(74) *Attorney, Agent, or Firm* — Lee & Morse, P.C.

(57) ABSTRACT

A magnetic memory device may include a first ferromagnetic layer, a second ferromagnetic layer, and a tunnel barrier layer arranged on a substrate. The tunnel barrier layer may include a crystal structure and may be arranged between the first ferromagnetic layer and the second ferromagnetic layer. At least the first ferromagnetic layer may include a first layer in contact with the tunnel barrier layer and a second layer in contact with the first layer, and an orientation of the first layer with respect to the tunnel barrier layer may be greater than an orientation of the second layer with respect to the tunnel barrier layer.

13 Claims, 5 Drawing Sheets

(56) References Cited

U.S. PATENT DOCUMENTS

| | | |
|---|---|---|
| 2007/0096229 A1* | 5/2007 | Yoshikawa et al. ............ 257/421 |
| 2008/0074805 A1 | 3/2008 | Ikarashi et al. |
| 2008/0124581 A1* | 5/2008 | Miura et al. ................ 428/811.1 |
| 2008/0174921 A1* | 7/2008 | Ikarashi et al. ................ 360/320 |
| 2008/0204943 A1 | 8/2008 | Fuji et al. |
| 2009/0080238 A1* | 3/2009 | Yoshikawa et al. ............ 365/158 |
| 2009/0251951 A1* | 10/2009 | Yoshikawa et al. ............ 365/158 |
| 2011/0031570 A1* | 2/2011 | Yuasa ............................ 257/421 |
| 2011/0094875 A1* | 4/2011 | Djayaprawira et al. ..... 204/192.2 |

* cited by examiner

MAGNETIC MEMORY DEVICES AND METHODS OF MANUFACTURING SUCH MAGNETIC MEMORY DEVICES

BACKGROUND

1. Field

Embodiments relate to memory devices and methods of fabricating memory device, and more particularly, to magnetic memory devices and methods of fabricating such magnetic memory devices.

2. Description of the Related Art

As electronic devices are functioning at higher speeds and with lower power consumption, memory devices are also required to function at faster read/write speeds and with lower power. Magnetic memory devices are being studied as memory devices that may satisfy such requirements. Magnetic memory devices may have characteristics such as non-volatility and relatively high speed operating characteristics, so they may be developed as next-generation memory devices.

Magnetic memory devices may include a magnetic tunnel junction pattern (MTJ). The magnetic tunnel junction pattern (MTJ) is generally formed with two magnetic substances and an insulating layer interposed between the two magnetic substances. Such a MTJ may have a different resistance value according to magnetization directions of the two magnetic substances. More specifically, when magnetization directions of the two magnetic substances are anti-parallel, the magnetic tunnel junction pattern (MTJ) may have a relatively large resistance value and when magnetization directions of two magnetic substances are parallel, the magnetic tunnel junction pattern (MTJ) may have a relatively small resistance value. Data may be written and read based on the difference in resistance values.

SUMMARY

Embodiments are therefore directed to a magnetic memory device and a method of fabricating such magnetic memory devices, which substantially overcome one or more of the problems due to the limitations and disadvantages of the related art.

It is therefore a feature of an embodiment to provide a magnetic memory device having an improved read and/or write margin than comparable conventional devices.

It is therefore a separate feature of an embodiment to provide a magnetic memory device having a larger read and/or write margin than comparable conventional devices.

It is therefore a separate feature of an embodiment to provide a magnetic memory device having improved properties of a magnetic tunnel junction thereof by improving an interface characteristic between a tunnel barrier layer and an adjacent free/reference layer as compared to comparable conventional devices.

It is therefore a separate feature of an embodiment to provide a method of fabricating a magnetic memory device having an improved read and/or write margin than comparable conventional devices.

It is therefore a separate feature of an embodiment to provide a method of fabricating a magnetic memory device having a larger read and/or write margin than comparable conventional devices.

It is therefore a separate feature of an embodiment to provide a method of manufacturing a magnetic memory device having improved properties of a magnetic tunnel junction thereof by improving an interface characteristic between a tunnel barrier layer and an adjacent free/reference layer as compared to comparable conventional devices.

At least one of the above and other features and advantages may be realized by providing a magnetic memory device, including a first ferromagnetic layer and a second ferromagnetic layer on a substrate, and a tunnel barrier layer including a crystal structure between the first ferromagnetic layer and the second ferromagnetic layer, wherein at least one of the first and second ferromagnetic layers includes a first layer in contact with the tunnel barrier layer and a second layer in contact with the first layer, and an orientation of the first layer with respect to the tunnel barrier layer is greater than an orientation of the second layer with respect to the tunnel barrier layer.

The first layer may include material having a same or similar crystal structure as a crystal structure of material included in the tunnel barrier layer.

The tunnel barrier may have a body centered cubic crystal structure and the first layer may have a body centered cubic structure or an NaCl type crystal structure.

A ratio of material of the first layer having a same or similar crystal structure as a crystal structure of material of the tunnel barrier layer may be higher than a ratio of material of the second layer having the same crystal structure as a crystal structure of the material of the tunnel barrier layer.

The at least one of the first and second ferromagnetic layers may further include a third layer on the second layer and an nonmagnetic layer between the second and third layers.

An exchange coupling force of material included in the second layer relative to the nonmagnetic layer may be greater than an exchange coupling force of material included in the first layer relative to the nonmagnetic layer.

A thickness ratio of the first and second layers may be 1:1.5 to 1:4.

The first layer and the second layer may each include CoFeB, wherein CoFeB included in the first layer has a higher content ratio of ferrum (Fe) than a content ratio of cobalt (Co), and wherein CoFeB included in the second layer has a higher content ratio of cobalt (Co) than a content ratio of ferrum (Fe).

The device may include a first electrode adjacent to the first ferromagnetic layer and a second electrode adjacent to the second ferromagnetic layer, wherein the first ferromagnetic layer, the tunnel barrier layer and the second ferromagnetic layer are sequentially stacked between the first electrode and the second electrode on the substrate.

The device may include an antiferromagnetic substance between the first electrode and the first ferromagnetic substance.

The device may include antiferromagnetic substance between the second electrode and the second ferromagnetic substance.

Each of the first and second ferromagnetic layers may include a first layer in contact with the tunnel barrier layer and a second layer in contact with the first layer, wherein for each of the first and second ferromagnetic layers an orientation of the corresponding first layer with respect to the tunnel barrier layer is greater than an orientation of the corresponding second layer with respect to the tunnel barrier layer.

The first ferromagnetic layer and the second ferromagnetic layer may include a same ferromagnetic material.

At least one of the above and other features and advantages may be separately realized by providing a method of manufacturing a magnetic memory device, the method including forming a first ferromagnetic layer on a substrate, forming a tunnel barrier layer including a crystal structure on the first ferromagnetic layer, forming a second ferromagnetic layer on the tunnel barrier layer, wherein at least one of the first and second ferromagnetic layers includes a first layer in contact with the tunnel barrier layer and a second layer in contact with the first layer, and an orientation of the first layer with respect to the tunnel barrier layer is greater than an orientation of the second layer with respect to the tunnel barrier layer.

Forming the tunnel barrier layer may include forming the tunnel barrier layer using a chemical vapor deposition process and/or an atomic layer deposition process.

The method may include, after forming the tunnel barrier layer, performing an annealing process.

The annealing process may be performed before the second ferromagnetic layer is formed.

The annealing process may be performed after the second ferromagnetic layer is formed.

The annealing process may be a magnetic annealing process.

Forming the at least one of the first and second ferromagnetic layers may include forming the first and second layers on the substrate, forming a third layer on the substrate, and forming a nonmagnetic layer between the third layer and the second layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
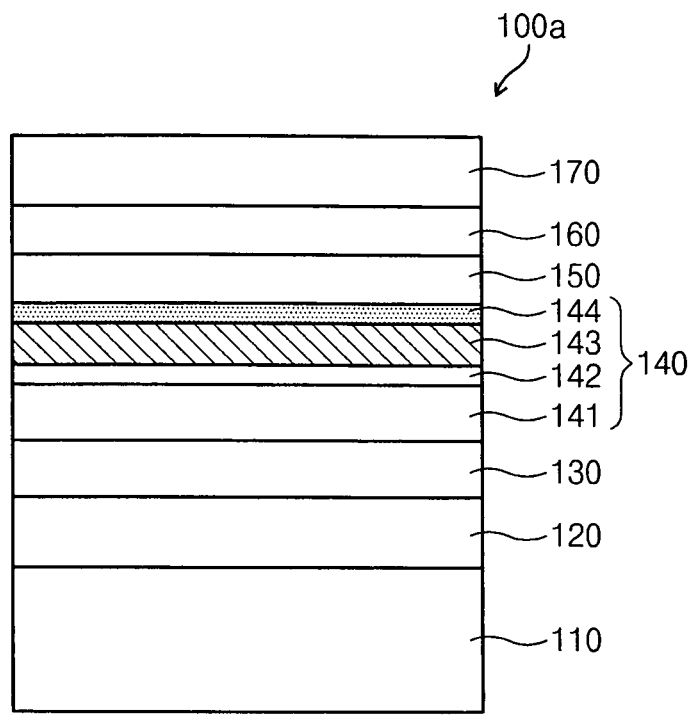
FIG. 1 illustrates a cross-sectional diagram of an exemplary embodiment of a magnetic memory device.

Korean Patent Application No. 10-2009-0004679, filed on Jan. 20, 2009, in the Korean Intellectual Property Office, and entitled: "Magnetic Memory Device," is incorporated by reference herein in its entirety.

Exemplary embodiments will be described below in more detail with reference to the accompanying drawings. Aspects of the invention may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout the specification.

In the drawing figures, the dimensions of layers and regions may be exaggerated for clarity of illustration. It will also be understood that when an element is referred to as being "on" another element, it can be directly on the other element, or intervening elements may also be present. Further, it will be understood that when an element is referred to as being "under" another element, it may be directly under, and one or more intervening elements may also be present. In addition, it will also be understood that when an element is referred to as being "between" two elements, it can be the only element between the two elements, or one or more intervening elements may also be present. Like reference numerals refer to like elements throughout the specification.

Figure 2:
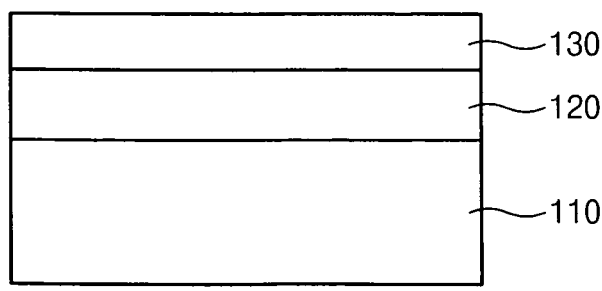
FIGS. 2 and 3 illustrate cross-sectional diagrams of stages in an exemplary method of forming the magnetic memory device of FIG. 1.
Figure 3:
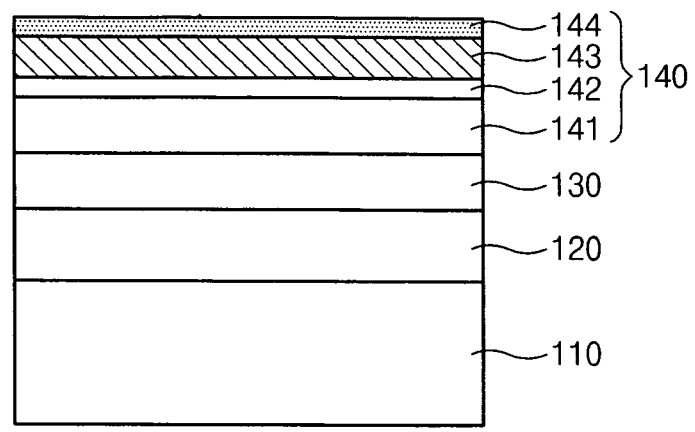

FIG. 1 illustrates a cross-sectional diagram of an exemplary embodiment of a magnetic memory device 100a. FIGS. 2 and 3 illustrate cross-sectional diagrams of stages in an exemplary method of forming the magnetic memory device 100a of FIG. 1.

Referring to FIG. 1, the magnetic memory device 100a may include a substrate 110, a lower electrode 120, a pinning layer 130, a synthetic antiferromagnetic layer (SAF) 140, a tunnel barrier layer 150, a free layer 160, and an upper electrode 170. In some embodiments, as shown in FIG. 1, and as described with reference to FIGS. 1-3 below, the pinning layer 130, the SAF layer 140, the tunnel barrier layer 150, and the free layer 160 may be sequentially stacked between the lower electrode 120 and the upper electrode 170. The SAF layer 140 may include a pinned layer 141, a nonmagnetic layer 142, and a reference layer (143, 144).

Referring to FIGS. 1 through 3, an exemplary embodiment of a method of forming the magnetic memory device 100a and features of the magnetic memory device 100a will be described. Referring to FIG. 2, the lower electrode 120 may be formed on the substrate 110. The substrate 110 may be a semiconductor substrate. The substrate 110 may include an insulating region and/or an active region. The lower electrode 120 may be electrically connected to the active region of substrate 110. The lower electrode 120 may be formed as an electrode type or an electrode contact type.

The pinning layer 130 may be formed on the lower electrode 120. The pinning layer 130 may pin a magnetization direction of a magnetic layer adjacent to the pinning layer 130. The pinning layer 130 may include an antiferromagnetic substance. The pinning layer 130 may include, e.g., PtMn, OrMn, MnO, MnS, MnTe, $FeCl_2$, FeO, $CoCl_2$, CoO, $NiCl_2$, NiO and/or Cr.

Referring to FIG. 3, the SAF layer 140 may be formed on the pinning layer 130. The SAF layer 140 may be formed by depositing a plurality of ferromagnetic material layers and nonmagnetic layers between the ferromagnetic material layers on the pinning layer 130. For example, the SAF layer 140 may be formed by sequentially depositing the pinned layer 141, the nonmagnetic layer 142 on the pinned layer 141 and the reference layer (143, 144) on the pinning layer 130.

The pinned layer 141 may include materials including a magnetization direction pinned by the pinning layer 130. For example, the pinned layer 141 may include a ferromagnetic substance. The pinned layer 141 may include, e.g., CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO and/or YFeO.

The nonmagnetic layer 142 may perform an exchange coupling of two ferromagnetic substances so that magnetization directions of two adjacent ferromagnetic substances may be anti-parallel to each other. For example, the nonmagnetic layer 142 may include ruthenium (Ru), iridium (Ir) and/or rhodium (Rh).

A magnetization direction of the reference layer (143, 144) may be pinned to be anti-parallel to a magnetization direction of the pinned layer 141 by the nonmagnetic layer 142. The reference layer (143, 144) may include a ferromagnetic substance. A magnetization direction of the reference layer (143, 144) may be oriented by performing annealing, e.g., magnetic annealing, during and/or after a formation of the reference layer (143, 144).

The reference layer (143, 144) may include a plurality of layers. The reference layer (143, 144) may include, e.g., a second reference layer 143 adjacent to the nonmagnetic layer 142 and a first reference layer 144 on the second reference layer 143.

The first reference layer 144 may include material that is highly oriented to a crystal structure of an adjacent layer, e.g., the tunnel barrier layer 150. For example, the first reference layer 144 may include material being more orientable to a specific crystal structure than a material of the second reference layer 143. An orientation may correspond to an extent that a crystal structure of a layer may be changed to be same or similar to a crystal structure of an adjacent layer. For example, a material that has a high orientation may correspond to a material having a crystal structure that has a high capability of being crystallized to have a same and/or similar crystal structure as another layer adjacent to it. More particularly, e.g., for the first reference layer 144 to have a higher orientation to a specific crystal structure, e.g., structure of the tunnel barrier layer 150, than the second reference layer 143, an extent that the first reference layer 144 is oriented to have the crystal structure of the tunnel barrier layer 150 is greater than an extent that the second reference layer 143 is oriented to have the crystal structure of the tunnel barrier layer 150. Further, e.g., for the first reference layer 144 to have a relatively high orientation to, e.g., the structure of the tunnel barrier layer 150, an extent that that the crystal structure of the first reference layer 144 may be crystallized to the same or similar structure as the crystal structure of the tunnel barrier layer 150 is great.

In embodiments, the first reference layer 144 may include a material having a high orientation with respect to the tunnel barrier layer 150. The first reference layer 144 may include, e.g., CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO and/or YFeO.

A composition ratio of elements of the first reference layer 144 may be controlled to have an orientation with respect to the tunnel barrier layer 150. Alternatively, the first reference layer 144 may include an elemental material having a high orientation with respect to the tunnel barrier layer 150. For example, the first reference layer 144 may include CoFeB having a high content ratio of ferrum (Fe). Here, that a content ratio of one element is high or low corresponds to the content ratio of one element being relatively high and low compared with a content ratio of the other element. More specifically, for a content ratio of ferrum to be high corresponds to the content ratio of ferrum (Fe) included in CoFeB being higher than a content ratio of cobalt (Co) and/or boron (B) included in CoFeB.

The second reference layer 143 may include a material with a great exchange coupling force with the nonmagnetic layer 142. For example, the second reference layer 143 may include CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO and/or YFeO. A composition ratio of elements of the second reference layer 143 may be controlled to have a great exchange coupling force with the nonmagnetic layer 142. For example, the second reference layer 143 may include CoFeB having a high content ratio of cobalt (Co). More specifically, e.g., for the content ratio of cobalt (Co) to be high may correspond to the content ratio of cobalt (Co) included in CoFeB to be higher than a content ratio of ferrum (Fe) and/or boron (B) included in CoFeB.

The second reference layer 143 may be formed to be thicker than the first reference layer 144. When the sum of first and second reference layers 144 and 143 is constant, an exchange coupling force between the second reference layer 143 and the nonmagnetic layer 142 may be greatly improved by increasing a thickness ratio of the second reference layer 143. For example, a thickness ratio of the first and second reference layers 144 and 143 may be 1:1.5 to 1:4.

The first and second reference layers 144 and 143 may be formed in an amorphous state on the nonmagnetic layer 142. The first and second reference layers 144 and 143 may be formed using one or more of various layer formation processes, e.g., a chemical vapor deposition process, an atomic layer deposition process and/or a physical vapor deposition process.

The nonmagnetic layer 142 may include, e.g., ruthenium (Ru), iridium (Ir) and/or rhodium (Rh).

Referring to FIG. 1, the tunnel barrier layer 150 may be formed to be in contact with the first reference layer 144. The tunnel barrier layer 150 may include an insulating material having a crystal structure. For example, the tunnel barrier layer 150 may include material having one crystal structure, e.g., one of various crystal structures such as a simple cubic, a body centered cubic crystal structure, a face centered cubic, a close-packed hexagonal cubic, etc. For more specific example, the tunnel barrier layer 150 may be magnesium oxide having a NaCl type crystal structure or aluminum oxide having close-packed hexagonal cubic. The tunnel barrier layer 150 may be formed by one process selected from various layer formation processes including, e.g., a chemical vapor deposition process and an atomic layer deposition process.

After the tunnel barrier layer 150 is formed, an annealing process may be performed. The annealing process may be, e.g., a magnetic annealing process and/or alternative annealing process. The amorphous second and first reference layers 143 and 144 may be crystallized by the annealing process. A crystal structure of the first reference layer 144 adjacent to the tunnel barrier layer 150 may be oriented along a crystal structure of the tunnel barrier layer 150. That is, at least a portion of first reference layer 144 may be crystallized to have the same and or similar crystal structure as a crystal structure of the tunnel barrier layer 150. For example, the first reference layer 144 may be crystallized to have a body centered cubic crystal structure or NaCl type crystal structure. More particularly, e.g., when the tunnel barrier layer 150 has a crystal structure of a body centered cubic crystal structure, the first and second reference layers 144 and 143 may include material having a crystal structure of a body centered cubic crystal structure and/or NaCl type crystal structure. Further, a ratio of an extent of the first reference layer 144 having a crystal structure of a body centered cubic crystal structure (or NaCl type crystal structure) may be greater than an extent of the second reference layer 143 having a crystal structure of a body centered cubic crystal structure (or NaCl type crystal structure).

The annealing process may be performed just after the tunnel barrier layer 150 is formed and/or after other layer is stacked. When the annealing process is included in the magnetic annealing process, the annealing process may be performed before a free layer 160 is formed.

During annealing the first reference layer 144, the second reference layer 143 may be also crystallized. An extent that the second reference layer 143 may be crystallized along a crystal structure of the tunnel barrier layer 150 may be less than an extent that the first reference layer 144 may be crystallized along a crystal structure of the tunnel barrier layer 150. A ratio of material having the same crystal structure as the crystal structure of material of the tunnel barrier layer 150 in the second reference layer 143 may be lower than a ratio of material having the same crystal structure as the crystal structure of material of the tunnel barrier layer 150 in the first reference layer 144. That is, an orientation of material constituting the second reference layer 143 with respect to the tunnel barrier layer 150 may be lower than an orientation of material constituting the first reference layer 144 with respect to the tunnel barrier layer 150.

The free layer 160 may be formed on the tunnel barrier layer 150. The free layer 160 may include material of which magnetization direction can be changed. The free layer 160 may include a ferromagnetic substance. For example, the free layer 160 may include CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO and/or YFeO. In an embodiment, the free layer 160 may include the same material as the first reference layer 144. In such a case, e.g., if the annealing may be performed after the free layer 160 is formed, the free layer 160 may include the same or similar crystal structure as the crystal structure of the tunnel barrier layer 150.

More particularly, in embodiments, magnetic resistance characteristics of a magnetic tunnel junction including the first reference layer 144 may be improved as a result of a high degree of crystallinity of the first reference layer 144. More specifically, as described above, the first reference layer 144 may have a relatively high degree of crystallinity and may be disposed to be adjacent to the tunnel barrier layer 150. Since the first reference layer 144 and the tunnel barrier layer 150 may have the same and/or similar crystal structure, an interface characteristic between the first reference layer 144 and the tunnel barrier layer 150 may be improved. Thus, a ratio of magnetic resistance of magnetic tunnel junction including the first reference layer 144 and the tunnel barrier layer 150 may increase. Therefore, reliability of a magnetic memory device, e.g., the magnetic memory device 100a, including such a magnetic tunnel junction may be improved.

Also, as discussed above, the free layer 160 may also have the same and/or similar crystal structure of the tunnel barrier layer 150. For example, the free layer 160 may include the same ferromagnetic substance as a ferromagnetic substance constituting the first reference layer 144. In such cases, an interface characteristic between the free layer 160 and the tunnel barrier layer 150 may be improved, so a magnetic tunnel junction having a ratio of a greater magnetic resistance may be provided.

The upper electrode 170 may be formed on the free layer 160. A capping layer (not shown) may be further formed between the free layer 160 and the upper electrode 170.

Referring back to FIG. 1, the exemplary magnetic memory device 100a will be described. In general, descriptions of features described above will be omitted.

In the magnetic memory device 100a, the lower electrode 120 and the upper electrode 170 may be disposed on a substrate 110. The pinning layer 130, the SAF layer 140, the tunnel barrier layer 150 and the free layer 160 may be sequentially stacked between the lower electrode 120 and the upper electrode 170. The SAF layer 140 may include the pinned layer 141, the nonmagnetic layer 142 and the second and first reference layers 143 and 144, which may be sequentially stacked.

Figure 4:
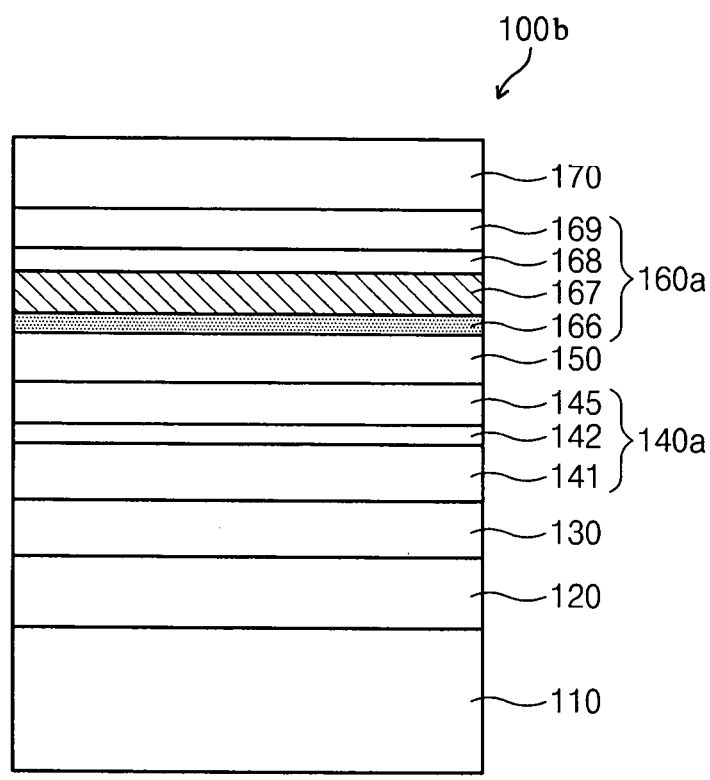
FIG. 4 illustrates a cross-sectional diagram of another exemplary embodiment of a magnetic memory device.
Figure 5:
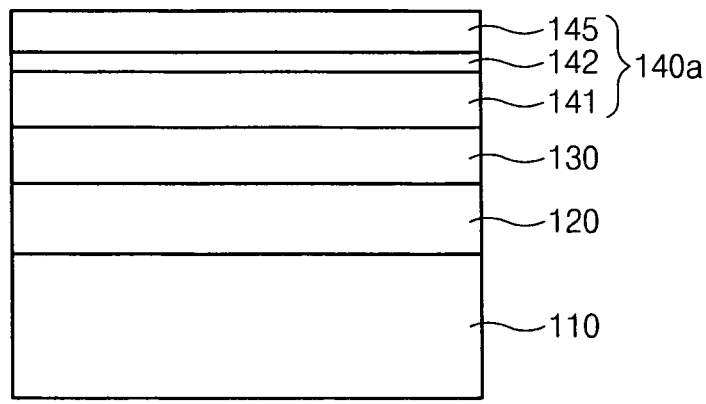
FIG. 5 illustrates a cross-sectional diagram of a stage in an exemplary method of forming the magnetic memory device of FIG. 4.

FIG. 4 illustrates a cross-sectional diagram of another exemplary embodiment of a magnetic memory device 100b, and FIG. 5 illustrates a cross-sectional diagram of a stage in an exemplary method of forming the magnetic memory device 100b of FIG. 4. In general, only differences between the magnetic memory device 100b of FIG. 4 and the magnetic memory device 100a of FIG. 1 will be described below.

Referring to FIGS. 4 and 5, an exemplary embodiment of a method of forming the magnetic memory device 100b and features of the magnetic memory device 100b thereof will be described.

Referring to FIG. 4, the magnetic memory device 100b may include the lower electrode 120, the first pinning layer 130, a first synthetic antiferromagnetic layer (SAF) 140a, the tunnel barrier layer 150, a second synthetic antiferromagnetic layer (SAF) 160a, and the upper electrode 170 on the substrate 110. The layers and electrodes may be sequentially formed on the substrate 110. The first SAF layer 140a may include the pinned layer 141 adjacent to the lower electrode 120, the nonmagnetic layer 142 on the pinned layer 141 and a reference layer 145 on the nonmagnetic layer 142. The second SAF layer 160a may include a first reference free layer 166, a second reference free layer 167, an antimagnetic free layer 168, and a ferromagnetic free layer 169.

The pinned layer 141 may include material of which a magnetization direction may be pinned by the first pinning layer 130. For example, the pinned layer 141 may include a ferromagnetic substance.

The nonmagnetic layer 142 may pin a magnetization direction of the pinned layer 141 to be anti-parallel to a magnetization direction of the reference layer 145. The nonmagnetic layer 142 may include, e.g., ruthenium (Ru), iridium (Ir) and/or rhodium (Rh).

The reference layer 145 may have a magnetization direction anti-parallel to a magnetization direction of the pinned layer 141 by the nonmagnetic layer 142. The reference layer 145 may include a ferromagnetic substance. In an embodiment, the reference layer 145 may include material having a high orientation with respect to the tunnel barrier layer 150. Thus, when an annealing process is performed after forming other layers, the reference layer 145 may be crystallized to have the same and/or similar crystal structure with a crystal structure of the tunnel barrier layer 150.

Referring to FIGS. 4 and 5, the tunnel barrier layer 150 may be formed on the first SAF layer 140a. The tunnel barrier layer 150 may include an insulating material of a crystalline state. For example, the tunnel barrier layer 150 may include magnesium oxide having a NaCl type crystal structure or aluminum oxide having close-packed hexagonal cubic structure.

The second SAF layer 160a may be formed on the tunnel barrier layer 150. More particularly, the second SAF layer 160a may include the first reference free layer 166 adjacent to the tunnel barrier layer 150, the second reference free layer 167 on the first reference free layer 166, the antimagnetic free layer 168 on the second reference free layer 167 and the ferromagnetic free layer 169 on the antimagnetic free layer 168 such that the respective layers may be sequentially stacked.

The first reference free layer 166 may include material having a great orientation with respect to the tunnel barrier layer 150. For example, the first reference free layer 166 may include material having greater orientation with respect to the tunnel barrier layer 150 than a material of the second reference free layer 167. More specifically, during an annealing process, more of the first reference free layer 166 may be crystallized to the same and/or similar crystal structure of the tunnel barrier layer 150 than, e.g., the second reference free layer 167. The first reference free layer 166 may include, e.g., CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO and/or YFeO. A composition ratio of elements constituting the selected material may be controlled so that a crystal structure of the first reference free layer 166 may be changed along a crystal structure of the tunnel barrier layer 150 during annealing. For example, the first reference free layer 166 may include CoFeB having a high content ratio of ferrum (Fe). The first reference free layer 166 may be formed on the tunnel barrier layer 150 as an amorphous state.

The second reference free layer 167 may include material having a great exchange coupling force with the nonmagnetic layer 142. For example, an exchange coupling force of a material of the second reference free layer 167 relative to the nonmagnetic layer 142 may be greater than an exchange coupling force of a material of the first reference free layer 166 relative to the nonmagnetic layer 142. The second reference free layer 167 may include, e.g., CoFeB, Fe, Co, Ni, Gd, Dy, CoFe, NiFe, MnAs, MnBi, MnSb, CrO, MnOFeO, FeOFeO, NiOFeO, CuOFeO, MgOFeO, EuO and/or YFeO. A composition ratio of elements of the second reference free layer 167 may be controlled to have a great exchange coupling force with the nonmagnetic layer 142. For example, the second reference free layer 167 may include CoFeB having a high content ratio of cobalt (Co). An exchange coupling force between the second reference free layer 167 and the nonmagnetic layer 142 may be an exchange coupling force resulting after a subsequent process is performed after the nonmagnetic layer 142 is formed.

The second reference free layer 167 may be formed to be thicker than the first reference free layer 166. For example, a thickness ratio of the first and second reference free layers 166 and 167 may be 1:1.5 to 1:4.

An annealing process may be further performed during and/or after a formation of the first reference free layer 166. The first reference free layer 166 may be crystallized by the annealing process. The annealing process of the first reference free layer 166 may be performed after a formation of the second reference free layer 167. In this case, an extent that the first reference free layer 166 is crystallized along the tunnel barrier layer 150 may be greater than an extent that the second reference free layer 167 is crystallized along the tunnel barrier layer 150. Thus, the first reference free layer 166 may include more materials having a crystal structure that is same and/or similar with the tunnel barrier layer 150 than the second reference free layer 167.

The upper electrode 170 may be formed on the second SAF layer 160. A capping layer (not shown) may be further formed between the second SAF layer 160a and the upper electrode 170.

Referring to FIG. 4, features of the magnetic memory device 100b will be described below. In general, descriptions of features described above will be omitted.

The lower electrode 120 and the upper electrode 170 may be disposed on the substrate 110. The first pinning layer 130, the first SAF layer 140a, the tunnel barrier layer 150 and the second SAF layer 160a may be sequentially stacked between the lower and upper electrodes 120 and 170.

The first pinning layer 130 may pin a magnetization direction of a portion of the first SAF layer 140a adjacent to the first pinning layer 130. The first pinning layer 130 may include an antiferromagnetic substance.

The first SAF layer 140a may include the pinned layer 141 adjacent to the first pinning layer 130, the nonmagnetic layer 142 on the pinned layer 141 and the reference layer 145 on the nonmagnetic layer 142. The pinned layer 141 may include material of which a magnetization direction may be pinned by the first pinning layer 130. For example, the pinned layer 141 may include a ferromagnetic substance.

The nonmagnetic layer 142 may pin a magnetization direction of the pinned layer 141 to be anti-parallel to a magnetization direction of the reference layer 145 by exchange coupling. The reference layer 145 may include a ferromagnetic substance. The reference layer 145 may have the same and/or similar crystal structure as a crystal structure of the tunnel barrier layer 150. More particularly, e.g., when the tunnel barrier layer 150 includes magnesium oxide having a NaCl type crystal structure, the reference layer 145 may have a crystal structure of a body centered cubic crystal structure or NaCl type crystal structure. The first SAF layer 140a may function as a reference layer of the magnetic memory device 100b.

The tunnel barrier layer 150 may include an insulating material of a crystalline state. For example, the tunnel barrier layer 150 may include magnesium oxide having a NaCl type crystal structure or aluminum oxide having close-packed hexagonal cubic structure.

The second SAF layer 160a may include the first reference free layer 166 adjacent to the tunnel barrier layer 150, the second reference free layer 167 on the first reference free layer 166, the antimagnetic free layer 168 on the second reference free layer 167 and the ferromagnetic free layer 169 on the antimagnetic free layer 168 such that the respective layers may be sequentially stacked. The second SAF layer 160a may function as a free layer of the magnetic memory device 100b. A magnetization direction of the second SAF layer 160a may be changeable. The first SAF layer 140a, the tunnel barrier layer 150 and the second SAF layer 160a may constitute a magnetic tunnel junction (MTJ).

The first reference free layer 166 may include material having a great orientation with respect to the tunnel barrier layer 150. More specifically, a crystal structure of the first reference free layer 166 may be a result of a crystal structure of the tunnel barrier layer 150. For example, the first reference free layer 166 may have the same and/or similar crystal structure as the crystal structure of the tunnel barrier layer 150. More particularly, e.g., when the tunnel barrier layer 150 may have a body centered cubic crystal structure, the first reference free layer 166 may have a body centered cubic crystal structure or NaCl type crystal structure.

Embodiments including a first reference free layer, e.g., 166, and a tunnel barrier layer, e.g., 150, may enable a magnetic resistance ratio of a magnetic memory device, e.g., the magnetic memory device 100b, to be improved due to an orientation of the first reference free layer 166, with respect to the tunnel barrier layer 150. More specifically, the first reference free layer 166 may include the same and/or similar crystal structure as the tunnel barrier layer 150 and may be disposed on the tunnel barrier layer 150. Accordingly, an interface characteristic between the first reference free layer 166 and the tunnel barrier layer 150 may be improved. Also, a magnetic resistance ratio of a magnetic tunnel junction including the first reference free layer 166 and the tunnel barrier layer 150 may be improved.

Further, in some embodiments, e.g., the reference layer 145 may have a same and/or similar crystal structure as the tunnel barrier layer 150. For example, the reference layer 145 may include the same ferromagnetic substance as a ferromagnetic substance of the first reference free layer 166. In such cases, a magnetic resistance ratio of a magnetic tunnel junction may be greatly improved. Thus, embodiments may provide a magnetic memory device, e.g., the magnetic memory device 100b, having improved reliability.

The second reference free layer 167 may include material having a great exchange coupling force with the nonmagnetic layer 142. In some embodiments, the second reference free layer 167 may include material having a greater exchange coupling force with the nonmagnetic layer 142 than material of the first reference free layer 166. More particularly, the second reference free layer 167 may include a ferromagnetic substance and a ratio of elements of the ferromagnetic substance may be controlled so that an exchange coupling force with the nonmagnetic layer 142 is improved. For example, the second reference free layer 167 may include CoFeB having a high content ratio of cobalt (Co). The second reference free layer 167 may be formed to be thicker than the first reference free layer 167. For example, a thickness ratio of the first and second reference free layers 166 and 167 may be 1:1.5 to 1:4.

Figure 6:
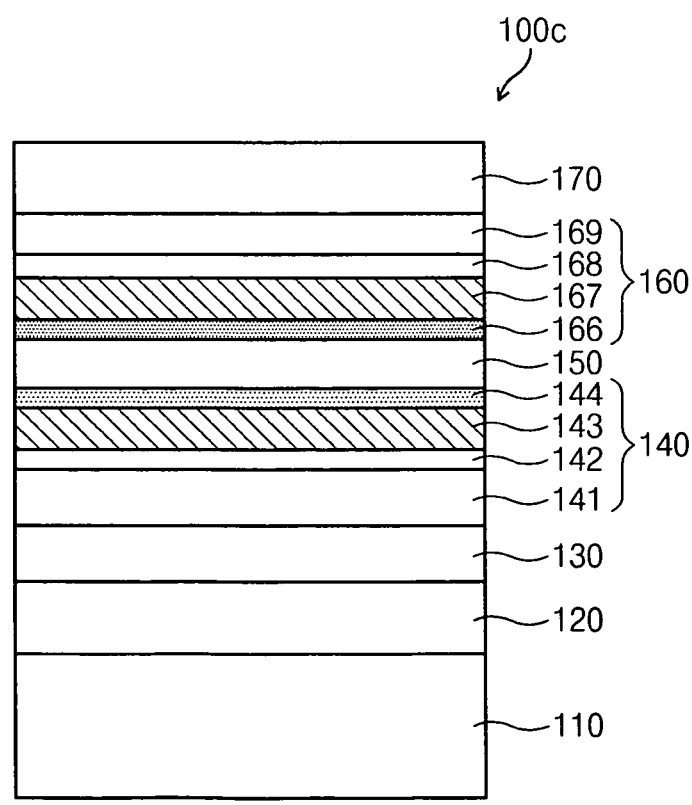
FIG. 6 illustrates a cross-sectional diagram of another exemplary embodiment of a magnetic memory device.
Figure 7:
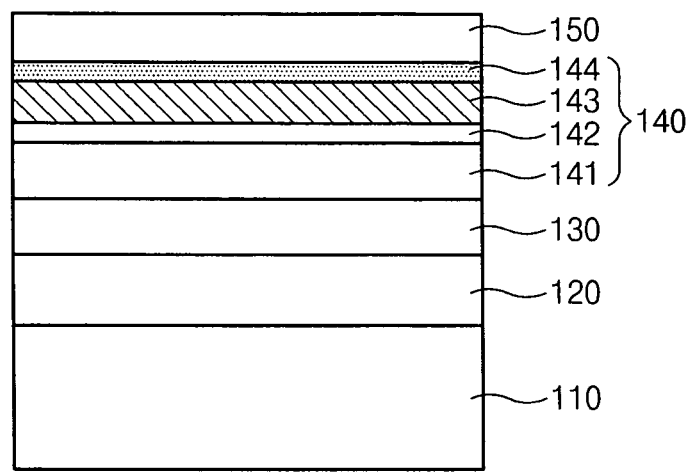
FIG. 7 illustrates a cross-sectional diagram of a stage in an exemplary method of forming the magnetic memory device of FIG. 6.

FIG. 6 illustrates a cross-sectional diagram of another exemplary embodiment of a magnetic memory device 100c, and FIG. 7 illustrates a cross-sectional diagram of a stage in an exemplary method of forming the magnetic memory device 100c of FIG. 6. In general, only differences between the magnetic memory device 100c of FIG. 6 and the magnetic memory device 100a, 100b of FIGS. 1 and 4 will be described below. Referring to FIGS. 6 and 7, an exemplary embodiment of a method of forming the magnetic memory device 100c and features of the magnetic memory device 100c thereof will be described.

Referring to FIG. 6, the magnetic memory device 100c may include the lower electrode 120, the first pinning layer 130, a first SAF layer 140, the tunnel barrier layer 150, a second SAF layer 160, and the upper electrode 170 on the substrate 110. The first SAF layer 140 may include the pinned layer 141, the nonmagnetic layer 142, and the reference layer (143, 144). The second SAF layer 160 may include, e.g., a reference free layer (166,167), an antimagnetic free layer 168 and a ferromagnetic free layer 169.

The first pinning layer 130 may include material that may pin at least a portion of a magnetization direction of the first SAF layer 140. For example, the pinning layer 130 may include an antiferromagnetic substance.

The first SAF layer 140 may include the pinned layer 141, the nonmagnetic layer 142 on the pinned layer 141 and the reference layer (143, 144) on the nonmagnetic layer 142. The first SAF layer 140 may function as a reference layer of the magnetic memory device 100c.

The pinned layer 141 may include material having a magnetization direction pinned by the pinning layer 130. The pinning layer 141 may include, e.g., a ferromagnetic substance.

The nonmagnetic layer 142 may pin magnetization directions of the pinned layer 141 and the reference layer (143, 144) so that the magnetization direction of the pinned layer 141 and the reference layer (143, 144) and the magnetization direction of the pinned layer 141 are anti-parallel to each other.

The reference layer (143, 144) may include the first reference layer 144 and the second reference layer 143. The first reference layer 144 may be adjacent to the tunnel barrier layer 150 and the second reference layer 143 may be adjacent to the nonmagnetic layer 142. The reference layer 143 and 144 may be formed as an amorphous state.

The first reference layer 144 may include material having a high orientation with respect to the tunnel barrier layer 150. Thus, a crystal structure of the first reference layer 144 may be changed to a same and/or similar crystal structure with a crystal structure of the tunnel barrier layer 150 during an annealing process. The first reference layer 144 may include a ferromagnetic substance and composition ratio of the ferromagnetic substance may be controlled so as to have a high orientation with respect to the tunnel barrier layer 150. For example, the first reference layer 144 may include CoFeB having a high content ratio of ferrum (Fe).

The second reference layer 143 may include material having a great exchange coupling force with the nonmagnetic layer 142. For example, the second reference layer 143 may include material having a greater exchange coupling force with the nonmagnetic layer 142 than material of the first reference layer 144. The second reference layer 143 may include a ferromagnetic substance and a composition ratio of the ferromagnetic substance may be controlled so as to improve an exchange coupling force with the nonmagnetic layer 142. For example, the second reference layer 143 may include CoFeB having a high content ratio of cobalt (Co).

The second reference layer 143 may be formed to be thicker than the first reference layer 144. Thus, the second reference layer 143 may have a great exchange coupling force with the pinned layer 141 than the first reference layer 144. For example, a thickness ratio of the first and second reference layers 144 and 143 may be 1:1.5 to 1:4.

The tunnel barrier layer 150 may have a crystal structure. For example, the tunnel barrier layer 150 may include magnesium oxide of a NaCl type crystal structure.

Referring to FIG. 6, the magnetic memory device 100c may include the first SAF layer 140 on one side of the tunnel barrier 150 and the second SAF layer 160 on another side of the tunnel barrier layer 150.

The second SAF layer 160 may include the reference free layer (166, 167), the antimagnetic free layer 168 and the ferromagnetic free layer 169, which may be sequentially stacked on the tunnel barrier layer 150. The second SAF layer 160 may function as a free layer of the magnetic memory device 100c.

The reference free layer (166, 167) may include a first reference free layer 166 adjacent to the tunnel barrier layer 150 and a second reference free layer 167 adjacent to the ferromagnetic free layer 169. The first reference free layer 166 may include material having a high orientation with respect to the tunnel barrier layer 150. For example, the first reference free layer 166 may include material having a higher orientation with respect to the tunnel barrier layer 150 than material of the second reference free layer 167. The first reference free layer 166 may include CoFeB having a high content ratio of ferrum (Fe). The second reference free layer 167 may include material having a great exchange coupling force with the nonmagnetic layer 142. The second reference free layer 167 may include CoFeB having a high content ratio of cobalt (Co). The second reference free layer 167 may be formed to be thicker than the first reference free layer 166. A thickness ratio of the first and second reference free layers 166 and 167 may be 1:1.5 to 1:4.

After the reference free layer (166, 167) is formed, an annealing process may be performed. The first reference layer 144 and/or the first reference free layer 166 may be crystallized by the annealing process. The first reference layer 144 and/or the first reference free layer 166 may be crystallized along a crystal structure of the tunnel barrier layer 150. For example, when the tunnel barrier layer 150 has a body centered cubic crystal structure, the first reference layer 144 and/or the first reference free layer 166 may be crystallized along a body centered cubic crystal structure. Thus, e.g., the first reference free layer 166 may have the same and/or similar crystal structure of the tunnel barrier 150, for example, a body centered cubic crystal structure or NaCl type crystal structure.

When the first reference layer 144 and/or the first reference free layer 166 are crystallized, the second reference layer 143 and/or the second reference free layer 167 may also be crystallized. In this case, an extent that the second reference layer 143 and/or the second reference free layer 167 may be crystallized along a crystal structure of the tunnel barrier layer 150 may be smaller than an extent that first reference layer 144 and/or the first reference free layer 166 may be crystallized along a crystal structure of the tunnel barrier layer 150.

Referring to FIG. 6, features of the magnetic memory device 100c will be described below. In general, descriptions of features described above will be omitted. Referring to FIG. 6, the magnetic memory device 100c may include the lower electrode 120, the first pinning layer 130, the first SAF layer 140, the tunnel barrier layer 150, the second SAF layer 160 and the upper electrode 170, which may be sequentially stacked on a substrate 110.

The first SAF layer 140 may function as a reference layer, having a pinned magnetization direction and the second SAF layer 160 may function as a free layer having a changeable magnetization direction of a magnetic memory device. Alternatively, the first SAF layer 140 may function as a free layer having a changeable magnetization direction and the second SAF layer 160 may function as a reference layer having a pinned magnetization direction.

In embodiments, data may be stored and/or read based on a resistance change in accordance with whether magnetization directions of the first and second SAF layers 140 and 160 are parallel or anti-parallel.

Hereinafter, a case that the first SAF layer 140 functions as a reference layer will be described.

The first SAF layer 140 may include the pinned layer 141 adjacent to the lower electrode 120, the first reference layer 144 adjacent to the tunnel barrier layer 150, and the second reference layer 143 adjacent to the nonmagnetic layer 142. The nonmagnetic layer 142 may be further interposed between the pinned layer 141 and the second reference layer 143.

The tunnel barrier layer 150 may include an insulating material having a crystal structure. For example, the tunnel barrier layer 150 may include magnesium oxide having a NaCl type crystal structure.

The first reference layer 144 may include material having the same and/or similar crystal structure as the tunnel barrier layer 150. For example, when tunnel barrier layer 150 includes a body centered cubic crystal structure, the first reference layer 44 may include a ferromagnetic substance having a crystal structure of a body centered cubic crystal structure and/or NaCl type crystal structure. The first reference layer 144 may include CoFeB having a high content ratio of ferrum (Fe). Here, that a content ratio of ferrum (Fe) being high or low corresponds to a relative amount compared with a content ratio of cobalt (Co) included in the CoFeB.

The second reference layer 143 may include material having a great exchange coupling force with the nonmagnetic layer 142. The second reference layer 143 may include CoFeB having a high content ratio of cobalt (Co). The second reference layer 143 may be thicker than the first reference layer 144. For example, a thickness ratio of the first and second reference layers 144 and 143 may be 1:1.5 to 1:4. Accordingly, an exchange coupling force between the second reference layer 143 and the nonmagnetic layer 142 can be greatly improved.

The second SAF layer 160 may include the first and second reference free layers 166 and 167, the ferromagnetic free layer 169 and the antimagnetic free layer 168. The first reference free layer 166 may be adjacent to the tunnel barrier layer 150 and second reference free layer 167 may be adjacent to the antimagnetic free layer 168. The ferromagnetic free layer 169 may be adjacent to the upper electrode 170. The antimagnetic free layer 168 may be interposed between the second reference layer 167 and the ferromagnetic free layer 169.

The first reference free layer 166 may have the same and/or similar crystal structure with the tunnel barrier layer 150. For example, when the tunnel barrier layer 150 includes a body centered cubic crystal structure, the first reference free layer 166 may include a ferromagnetic substance having a crystal structure of a body centered cubic crystal structure or NaCl type crystal structure. The first reference free layer 166 may include CoFeB having a high content ratio of ferrum (Fe).

The second reference free layer 167 may include material having a great exchange coupling force with the nonmagnetic layer 142. The second reference free layer 167 may include CoFeB having a high content ratio of cobalt (Co). The second reference free layer 167 may be thicker than the first reference free layer 166. For example, a thickness ratio of the first and second reference free layers 166 and 167 may be 1:1.5 to 1:4. Accordingly, an exchange coupling force between the second reference free layer 167 and the nonmagnetic layer 142 can be greatly improved.

As described above, in embodiments, a tunnel barrier layer including a crystal and a first ferromagnetic substance disposed on a first side of the tunnel barrier and a second ferromagnetic substance disposed on a second side of the tunnel barrier layer may be provided. At least one of the first and second ferromagnetic substances may include a first layer and a second layer adjacent to the tunnel barrier layer and material constituting the first layer may have a greater orientation with respect to the tunnel barrier layer than material of the second layer. As an orientation with respect to the tunnel barrier layer of the first layer becomes great, an interface characteristic between the first layer and the tunnel barrier layer may be improved. Accordingly, a magnetic resistance ratio of a magnetic tunnel junction including the first layer and the tunnel barrier layer may be increased. Thus, a magnetic memory device having a large read and/or write margin may be provided.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A magnetic memory device, comprising:
   a substrate;
   a first ferromagnetic layer on the substrate, the first ferromagnetic layer including a free layer;
   a second ferromagnetic layer on the substrate, between the first ferromagnetic layer and the substrate; and
   a tunnel barrier layer including a crystal structure between the first ferromagnetic layer and the second ferromagnetic layer,
   wherein:
   the second ferromagnetic layer includes a crystalline first layer in contact with the tunnel barrier layer and a crystalline second layer in contact with the first layer, the first and second layers each including CoFeB,
   CoFeB included in the first layer has a higher content ratio of Fe than a content ratio of Co, and
   CoFeB included in the second layer has a higher content ratio of Co than a content ratio of Fe.

2. The magnetic memory device as claimed in claim 1, wherein the at least one of the first and second ferromagnetic layers further includes:
   a third layer on the second layer; and
   a nonmagnetic layer between the second and third layers.

3. The magnetic memory device as claimed in claim 2, wherein an exchange coupling force of material included in the second layer relative to the nonmagnetic layer is greater than an exchange coupling force of material included in the first layer relative to the nonmagnetic layer.

4. The magnetic memory device as claimed in claim 1, wherein a thickness ratio of the first and second layers is 1:1.5 to 1:4.

5. The magnetic memory device as claimed in claim 1, further comprising a first electrode adjacent to the first ferromagnetic layer and a second electrode adjacent to the second ferromagnetic layer, wherein the first ferromagnetic layer, the tunnel barrier layer and the second ferromagnetic layer are sequentially stacked between the first electrode and the second electrode on the substrate.

6. The magnetic memory device as claimed in claim 5, further comprising an antiferromagnetic substance between the first electrode and the first ferromagnetic layer.

7. The magnetic memory device as claimed in claim 5, further comprising an antiferromagnetic substance between the second electrode and the second ferromagnetic layer.

8. The magnetic memory device as claimed in claim 1, wherein the first ferromagnetic layer and the second ferromagnetic layer include a same ferromagnetic material.

9. A magnetic memory device, comprising:
a first ferromagnetic layer and a second ferromagnetic layer on a substrate; and
a tunnel barrier layer including a crystal structure between the first ferromagnetic layer and the second ferromagnetic layer, wherein:
at least one of the first and second ferromagnetic layers includes a crystalline first layer in contact with the tunnel barrier layer and a crystalline second layer in contact with the first layer, the first and second layers each including CoFeB, CoFeB included in the first layer having a higher content ratio of Fe than a content ratio of Co, and CoFeB included in the second layer having a higher content ratio of Co than a content ratio of Fe, and
an exchange coupling force of material included in the second layer relative to material included in a nonmagnetic layer is greater than an exchange coupling force of material included in the first layer relative to the material included in the nonmagnetic layer when the material included in the second layer and the material included in the first layer are in the same distance from the material included in the nonmagnetic layer.

10. The magnetic memory device as claimed in claim 9, wherein:
the nonmagnetic layer is between the second and third layers, and
the at least one of the first and second ferromagnetic layers further includes a third layer on the second layer.

11. The magnetic memory device as claimed in claim 9, further comprising a first electrode adjacent to the first ferromagnetic layer and a second electrode adjacent to the second ferromagnetic layer, wherein the first ferromagnetic layer, the tunnel barrier layer, and the second ferromagnetic layer are sequentially stacked between the first electrode and the second electrode on the substrate.

12. The magnetic memory device as claimed in claim 11, further comprising an antiferromagnetic substance between the first electrode and the first ferromagnetic layer.

13. The magnetic memory device as claimed in claim 11, further comprising an antiferromagnetic substance between the second electrode and the second ferromagnetic layer.

* * * * *